United States Patent
Rodriguez et al.

(10) Patent No.: US 11,630,161 B1
(45) Date of Patent: Apr. 18, 2023

(54) FLEXIBLE CIRCUIT FOR DROOP DETECTION

(71) Applicant: Advanced Micro Devices, Inc., Santa Clara, CA (US)

(72) Inventors: Miguel Rodriguez, Golden, CO (US); Stephen Victor Kosonocky, Fort Collins, CO (US); Kaushik Mazumdar, Waltham, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/521,601

(22) Filed: Nov. 8, 2021

(51) Int. Cl.
*G01R 31/40* (2020.01)
*H03K 19/0175* (2006.01)
*H03K 5/24* (2006.01)
*H03M 3/00* (2006.01)

(52) U.S. Cl.
CPC ............... *G01R 31/40* (2013.01); *H03K 5/24* (2013.01); *H03K 19/017509* (2013.01); *H03M 3/30* (2013.01)

(58) Field of Classification Search
CPC .. G01R 31/40; H03K 5/24; H03K 19/017509; H03M 3/30
See application file for complete search history.

(56) References Cited

U.S. PATENT DOCUMENTS

| 9,369,269 | B2 * | 6/2016 | Dionne | ............... H04L 7/033 |
| 2018/0343014 | A1 * | 11/2018 | Todorokihara | ........ H03M 3/372 |
| 2021/0080510 | A1 * | 3/2021 | Orlik | ................... H03M 3/378 |

* cited by examiner

*Primary Examiner* — Giovanni Astacio-Oquendo
(74) *Attorney, Agent, or Firm* — Polansky & Associates, P.L.L.C.; Paul J. Polansky; Nathan H. Calvert

(57) ABSTRACT

A power supply monitor includes a delta-sigma modulator including an input receiving a binary number and an output providing a pulse-density modulated signal, the delta-sigma modulator operable to scale the pulse-density modulated signal based on the binary number. A fast droop detector circuit includes a level shifter providing the modulated signal referenced to a clean supply voltage. A lowpass filter is coupled between the level shifter and a comparator. The comparator produces a droop detection signal at said output responsive to a monitored supply voltage dropping below a predetermined level relative to the filtered signal.

20 Claims, 7 Drawing Sheets

US 11,630,161 B1

FLEXIBLE CIRCUIT FOR DROOP DETECTION

BACKGROUND

Integrated circuits and discrete circuits often include terminals for receiving power from a power supply to provide a source voltage for the associated circuitry. A circuit, for example an inverter, is often connected between the supply and circuit common or ground. In the case of metal-oxide semiconductor field-effect transistors (MOSFETs), a specified voltage at a gate terminal activates the transistor to create a circuit path to drive circuit elements connected between an output terminal and the supply or ground and to drive the operation of subsequent circuits connected to the output terminal. Typically, the amount of current and circuit loading is related to both the operation speed and power supply voltage. Because of the active nature of many circuits, the loading will sometimes vary and, at times, may cause a supply voltage level to drop or be lowered from the desired level.

Voltage droop is a term used to refer to the drop in voltage from the desired voltage level as the supply drives a load. In a regulated system, the output voltage can sag when a load is suddenly increased very rapidly. For example, a transient loading condition may occur causing a voltage droop. If the droop is too large, then circuit failure results.

In prior art systems, supply adjustment circuits, or "header" circuits, are operably disposed between a supply and a circuit and are regulated to adjust or compensate for such variations in the supply. For example, some solutions include header circuits that constantly switch at a relatively high frequency above 1 GHz to minimize the loading from the transient response and to regulate the supply voltage. These header circuits are often optimized to respond very quickly to voltage droops due to transient loading conditions and other loading conditions.

These prior art systems typically have substantial customized analog design blocks and add significant overhead as they switch in and out of connecting relatively large field effect transistors in order to respond to transient loading conditions. This overhead even occurs when operating in a steady-state mode. Thus, such systems not only consume precious integrated circuit real estate, but also are inefficient from a power perspective.

Figure 1:
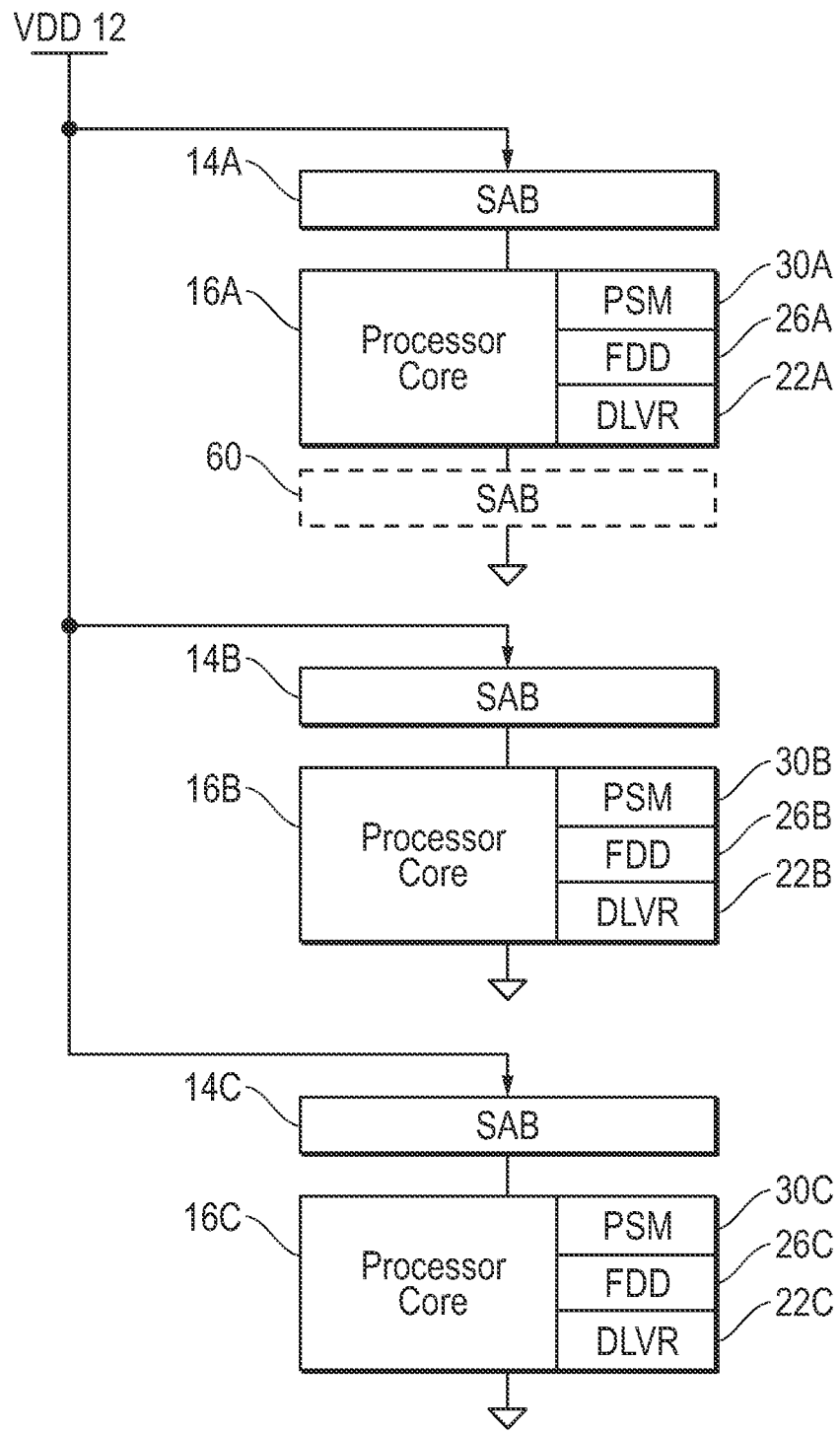
FIG. 1 illustrates, in block diagram form, a system for regulating supply voltages to a plurality of processor cores according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A power supply monitor includes a delta-sigma modulator and a fast droop detector. The delta-sigma modulator including an input receiving a binary number and an output providing a pulse-density modulated signal, the delta-sigma modulator operable to scale the pulse-density modulated signal based on the binary number. The fast droop detector circuit includes a level shifter, a lowpass filter, and a comparator. The level shifter includes an input receiving the pulse-density modulated signal and an output providing the pulse-density modulated signal referenced to a clean supply voltage. The lowpass filter having an input coupled to the output of the level shifter and an output. The comparator includes a first input coupled to the output of the lowpass filter, a second input receiving a monitored supply voltage, and an output. The comparator produces a droop detection signal at said output responsive to the monitored supply voltage dropping below a predetermined level relative to the first input.

A method of monitors a power supply. The method includes receiving a binary number, and creating a pulse-density modulated signal referenced to a first supply voltage and scaled based on the binary number. The pulse-density modulated signal is level-shifted to produce a level-shifted pulse-density modulated signal referenced to a clean supply voltage. This level-shifted pulse-density modulated signal is lowpass filtered to create an analog signal, which is compared to a monitored supply voltage to detect a droop in the monitored supply voltage.

A data processing system includes an integrated circuit including at least two processor tiles each comprising: a processor core comprising digital logic, a local clock providing a clock signal for synchronizing the digital logic, and a local power supply monitor for monitoring a respective monitored local supply voltage. Each power supply monitor includes a delta-sigma modulator including an input receiving a binary number and an output providing a pulse-density modulated signal referenced to a first supply voltage, the delta-sigma modulator operable to scale the pulse-density modulated signal based on the binary number. Each power supply monitor includes a droop detection circuit. The droop detection circuits include a level shifter including an input receiving the pulse-density modulated signal and an output providing the pulse-density modulated signal referenced to a clean supply voltage. A lowpass filter has an input coupled to the output of the level shifter and an output. A comparator has a first input coupled to the output of the lowpass filter, a second input receiving a respective monitored local supply voltage, and an output. The comparator produces a droop detection signal at said output responsive to the respective monitored local supply voltage dropping below a predetermined level relative to the first input.

FIG. 1 illustrates, in block diagram form, a system for regulating supply voltages to a plurality of processor cores according to the prior art. A supply VDD 12 is connected to a plurality of supply adjustment blocks (SAB) 14A-C. Each of the supply adjustment blocks 14A-C is connected to produce an adjusted supply voltage to a processor core 16A-C. Each of the processor cores 16A-C includes a power supply monitor (PSM) 30A-C, a fast droop detector (FDD) 26A-C, and a digital low voltage regulator (DLVR) 22A-C. Each DLVR 22A-C is formed within the processor core 16A-C, respectively. The processor cores and their associated circuitry may be referred to as a "processor tile".

In some versions, a supply adjustment block 60 may be used either in addition to or in place of a supply adjustment block 14. As may be seen, supply adjustment block 60 is a footer circuit rather than a header circuit meaning that the supply adjustment block is connected between the processor core and ground instead of being connected between the processor core and the supply. In versions where a supply of adjustment block 60 is included, the specific discrete logic is modified to support the desired operations and one of average skill in the art may readily make such transformations in design. The first and second regulators would remain the same. Thus, for example, a charge inject signal generated by FDD 26A-C would serve to activate or select resistive elements within supply adjustment block 60. While only one supply adjustment block 60 is shown in dashed lines, it should be understood that a plurality of supply adjustment blocks 60 could be included in the version of FIG. 1. As with a supply adjustment block 14 comprising a header circuit, a second regulator, namely FDD 26A-C, generates a charge inject signal that causes selected resistive elements to be activated to adjust the voltage drop across the supply adjustment block 14A-C and therefore to adjust voltage produced to the processor core 16A-C.

Figure 2:
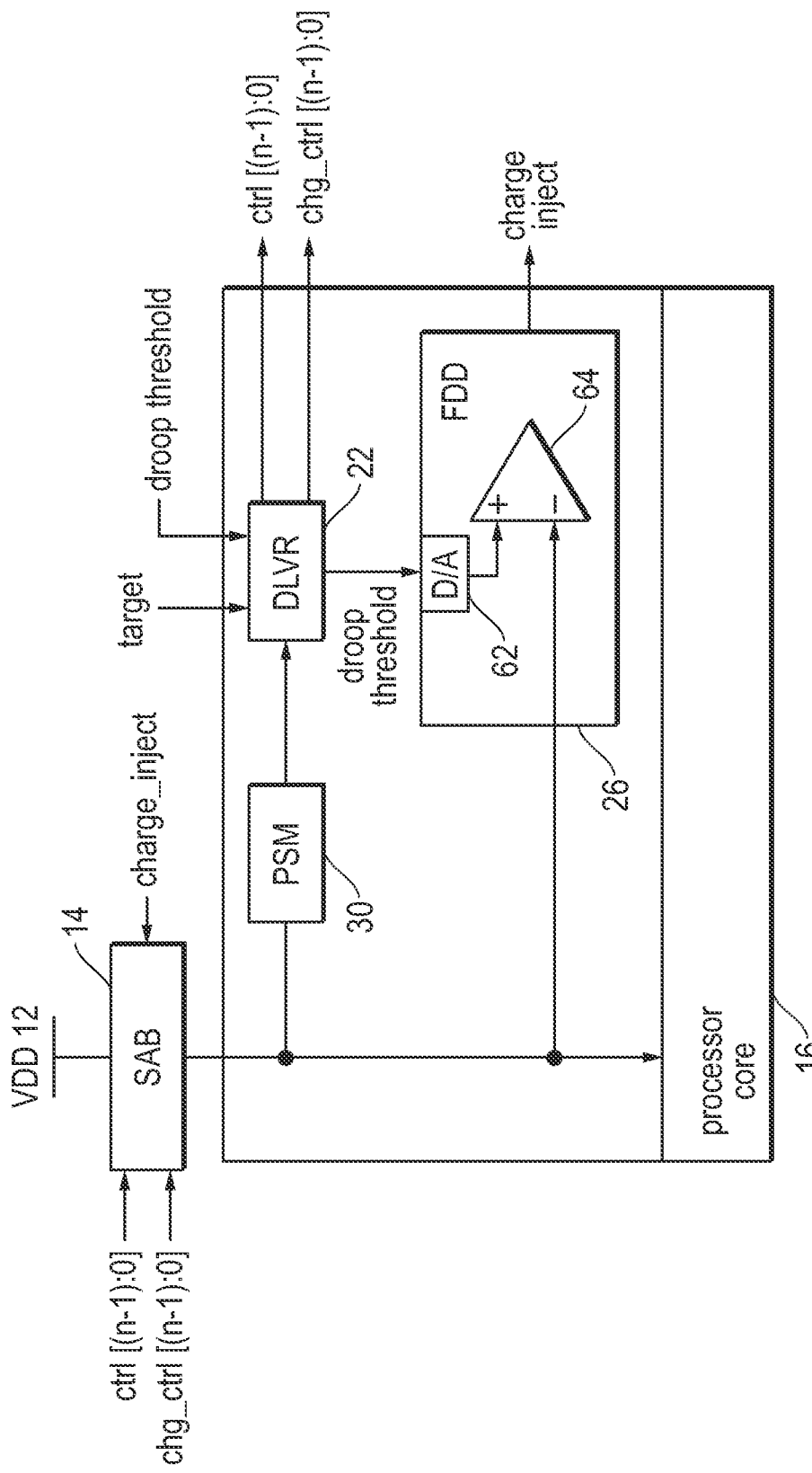
FIG. 2 illustrates, partially in block diagram form and partially in schematic form, further details of a regulator system that compensates for droop according to the prior art.

FIG. 2 illustrates, partially in block diagram form and partially in schematic form, further details of a regulator system that compensates for droop according to one embodiment of the invention. A supply voltage VDD 12 is connected to supply adjustment block 14 that in turn produces the adjusted supply voltage to processor core 16. The magnitude of the adjusted supply voltage is based upon the values of a control word, a charge control word and the charge inject signal generated by FDD 26. In the described version, PSM 30, DLVR 22 (the first regulator), and FDD 26 (the second regulator) are all formed within processor core block 16 in the version of FIG. 2.

The adjusted supply voltage is produced to PSM 30 that in turn produces the digital representation of the adjusted supply voltage magnitude to DLVR 22. The adjusted supply voltage is also produced to FDD 26. DLVR 22 is further connected to receive the target adjusted supply voltage, shown as target ADJ VDD, and the droop threshold level from an external source. The external source may be a power management block in one embodiment. DLVR 22 produces the droop threshold level to FDD 26. DLVR 22 also produces the control word "ctrl [(n−1):0]" and the charge control word "chg_ctrl [(n−1):0]" to supply adjustment block 14.

FDD 26 includes a digital-to-analog converter (DAC) 62 that is connected to receive the droop threshold level from DLVR 22 and is configured to produce an analog signal whose magnitude corresponds to the received droop threshold level to a plus (+) input of a comparator 64. In the depicted version, DAC 62 is a sigma-delta converter. A minus (−) of comparator 64 is connected to receive the adjusted supply voltage produced by supply adjustment block 14. Comparator 64 generates the charge inject signal that activates the supply adjustment block whenever the adjusted supply voltage falls below the analog droop threshold level or voltage. It should be noted, in the charge selection block utilizes NAND logic, a logic one for the charge injection signal triggers the charge injection or, more specifically, supply voltage adjustment for a selected MOSFET. A logic zero is only generated when the droop threshold is lower than the adjusted supply voltage. It should also be noted that the version of FIG. 2 includes a first regulator (DLVR 22) formed within processor core block 16. In an alternative version, the first regulator, namely DLVR 22, may be formed outside of processor core 16.

FDD 26 performs its processing very quickly by performing an analog comparison of the adjusted supply voltage and the droop threshold. Accordingly, the charge injection signal may be generated nearly instantly and may be generated much more quickly than processor-based digital logic that requires a number of clock cycles to obtain all necessary data and to process the data. As such, the second control loop that includes FDD 26 is a fast-acting control loop to immediately correct or regulate the adjusted supply voltage whenever the adjusted supply voltage falls below the droop threshold level. The first regulation loop, in contrast, that includes the first regulator (DLVR 22), is a slower acting loop that compares the adjusted supply voltage to a target adjusted supply voltage value. By utilizing a fast acting second control loop with FDD 26, a simpler and slower first regulation loop may be utilized to reduce IC real estate and associated power consumption. Moreover, because the decision-making in the second control loop is made in analog (real time), the first control loop may be clocked at a lower rate thereby saving power.

Figure 3:
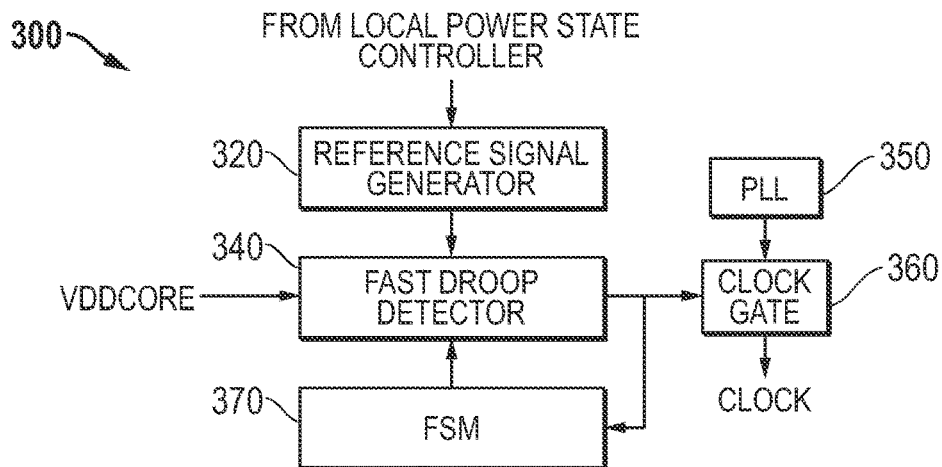
FIG. 3 illustrates in block diagram form a power supply monitor according to some embodiments.

FIG. 3 illustrates in block diagram form a power supply monitor 300 according to some embodiments. Power supply monitor 300 includes a reference signal generator 320, a fast droop detector 340, phase-locked loop (PLL) 350, a clock gate 360, and a finite state machine 370.

Reference signal generator 320 has an input connected to a local power controller and receiving a digital number indicating a reference voltage, and an output providing a modulated digital signal indicating the reference voltage. The reference voltage is associated with the desired level of a local supply voltage "VDDCORE" to be monitored. Fast droop detector 340 has a first input connected to the output of reference signal generator 320, a second input receiving the VDDCORE supply voltage, a third input, and an output.

PLL 350 has a number of control and enable inputs (not shown) and an output providing a clock signal. Clock gate 360 has an input receiving the clock signal from PLL 350, an input connected to the output of fast droop detector 340, and an output for providing a gated or ungated clock signal for synchronizing circuitry within a domain of the monitored supply voltage.

FSM 370 has an input connected to the output of fast droop detector 340, and an output connected to the second input of fast droop detector 340, and may include a number of other control inputs (not shown). FSM 370 may include a counter to employ in determining when to reset the clock gate control signal.

In operation, the local power controller for the voltage domain of the monitored supply voltage is operable to adjust the monitored supply voltage and provide a new value for the binary number to the reference signal generator corresponding to the adjusted monitored supply voltage. Reference signal generator 320 provides a digitally modulated signal, such as a pulse-density modulated signal, carrying the provided value. Fast droop detector 340 compares the VDDCORE supply voltage to an analog signal based on the digitally modulated signal to detect droops in the VDD-CORE supply voltage. Based on detecting such a droop, fast droop detector 340 controls clock gate 360 to gate the clock signal for a designated period to reduce the power consumed by the circuit and mitigate the drooping voltage on the VDDCORE supply. FSM 370 controls the designated period by resetting the clock gate control signal a, such as by controlling a latch.

Figure 4:
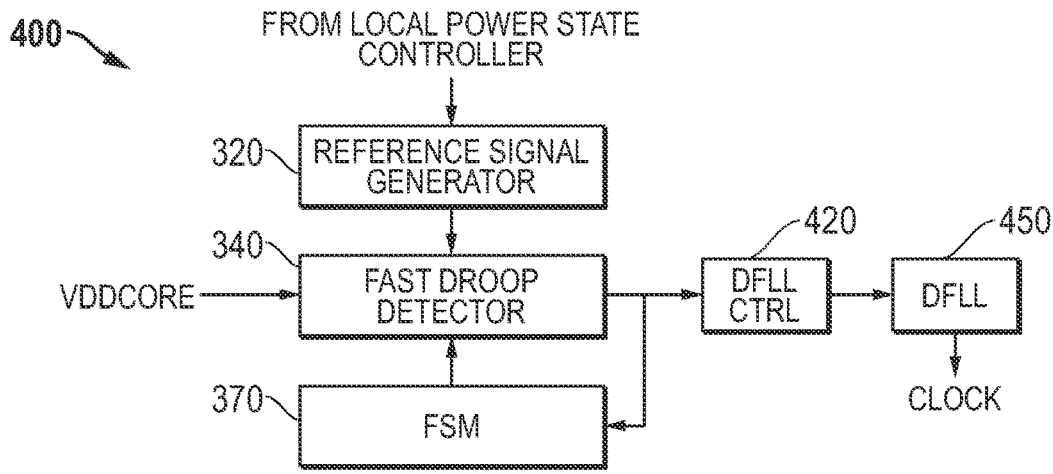
FIG. 4 illustrates a block diagram of a power supply monitor according to some additional embodiments.

FIG. 4 illustrates a block diagram of a power supply monitor 400 according to some additional embodiments. Power supply monitor 400 includes a reference signal generator 320, a fast droop detector 340, a digital frequency-locked loop (DFLL) 450, a DFLL control circuit 420, and a finite state machine 370. In this embodiment, the droop detection performed by fast droop detector 340 is used to control DFLL 450 to increase or decrease its output clock signal frequency.

Reference signal generator 320 has an input connected to a local power controller and receiving a digital number indicating a reference voltage, and an output providing a modulated digital signal indicating the reference voltage. The reference voltage is associated with the desired level of local supply voltage "VDDCORE" to be monitored. Fast droop detector 340 has an input connected to the output of reference signal generator 320, an input receiving the VDD-CORE supply voltage, a second input, and an output.

DFLL 450 has a number of control and enable inputs (not shown) and an output providing a clock signal for synchronizing circuitry within a domain of the monitored supply voltage. DFLL control circuit 420 has an input connected to the output of fast droop detector 340, and an output connected to DFLL 450.

FSM 370 has an input connected to the output of fast droop detector 340, an output connected to the second input of fast droop detector 340, and may include a number of other control inputs (not shown).

In operation, the local power controller for the voltage domain of the monitored supply voltage is operable to adjust the monitored supply voltage and provide a new value for the binary number to reference signal generator 320 corresponding to the adjusted monitored supply voltage. Reference signal generator 320 provides a digitally modulated signal carrying the provided value. Fast droop detector 340 compares the VDDCORE supply voltage to an analog signal based on the digitally modulated signal to detect droops in the VDDCORE supply voltage. Based on detecting such a droop, fast droop detector 340 sends a droop detected signal to DFLL control circuit 420. Based on this signal, DFLL control circuit 420 commands DFLL to slow the clock, or stop and then slow the clock, for a designated period.

Figure 5:
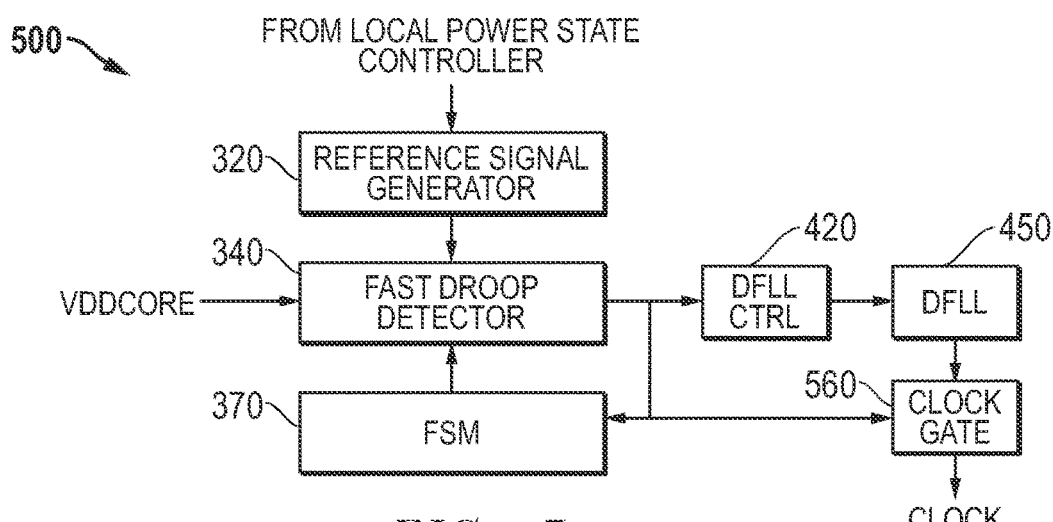
FIG. 5 shows in block diagram form a power supply monitor according to further additional embodiments.

FIG. 5 shows in block diagram form a power supply monitor 500 according to further additional embodiments. Power supply monitor 400 includes a reference signal generator 320, a fast droop detector 340, a digital frequency-locked loop (DFLL) 450, a DFLL control circuit 420, a clock gate 560, and a finite state machine 370. In this embodiment, the DFLL control scheme of FIG. 4 is used together with clock gate 560 in order to provide more rapid response to detected droops.

Reference signal generator 320 has an input connected to a local power controller and receiving a digital number indicating a reference voltage, and an output providing a modulated digital signal indicating the reference voltage. The reference voltage is associated with the desired level of local supply voltage "VDDCORE" to be monitored. Fast droop detector 340 has an input connected to the output of reference signal generator 320, an input receiving the VDD-CORE supply voltage, a second input, and an output.

DFLL 450 has a number of control and enable inputs (not shown) and an output providing a clock signal for synchronizing circuitry within a domain of the monitored supply voltage. DFLL control circuit 420 has an input connected to the output of fast droop detector 340, and an output connected to DFLL 450. Clock gate 560 has a first input connected to the output of DFLL 450, a second input connected to the output of fast droop detector 340, and an output for selectively providing the clock signal from DFLL 450.

FSM 370 has an input connected to the output of fast droop detector 340, an output connected to the second input of fast droop detector 340, and may include a number of other control inputs (not shown).

In operation, the local power controller for the voltage domain of the monitored supply voltage is operable to adjust the monitored supply voltage and provide a new value for the binary number to the reference signal generator corresponding to the adjusted monitored supply voltage. Reference signal generator 320 provides a digitally modulated signal carrying the provided value. Fast droop detector 340 compares the VDDCORE supply voltage to an analog signal based on the digitally modulated signal to detect droops in the VDDCORE supply voltage. Based on detecting such a droop, fast droop detector 340, sends a droop detected signal to clock gate 560 and DFLL control circuit 420. Based on this signal, clock gate 560 gates the clock to immediately gate the clock while DFLL control circuit 420 commands DFLL 450 to slow the clock for a designated period. Because DFLL 450 is relatively slow in responding to commands to implement a change in clock frequency, fast droop detector 340 is also responsive to the droop detection signal to control clock gate 560 to gate the clock signal for a designated period to reduce the power consumed by the circuit and mitigate the drooping voltage on the VDDCORE supply. FSM 370 controls the designated period by resetting the clock gate control signal, such as by controlling a latch.

Figure 6:
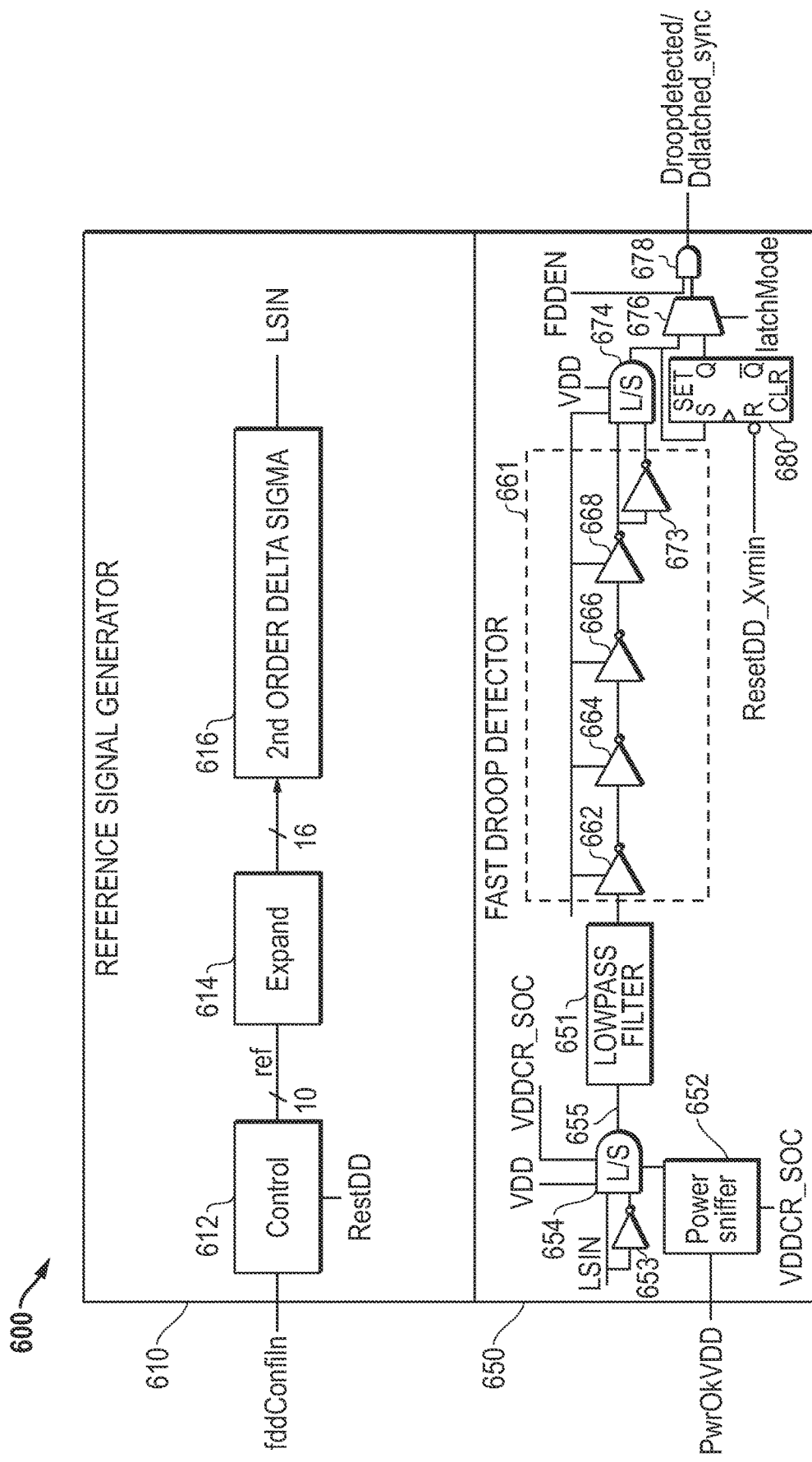
FIG. 6 shows in mixed block diagram and circuit diagram form a power supply monitor according to further additional embodiments.

FIG. 6 shows in mixed block diagram and circuit diagram form a portion of a power supply monitor 600 according to further additional embodiments. The depicted portion of a power supply monitor 600 is suitable for use with the monitoring and control topologies shown in FIG. 3, FIG. 4, and FIG. 5, as well as other circuits in which a power supply is monitored to detect fast droops of the power supply voltage. For example, the design of power supply monitor 600 is employed in some embodiments to control a charge injection system such as the prior art system shown in FIG. 1 and FIG. 2. Power supply monitor 600 generally includes a reference signal generator 610 and a fast droop detector circuit 650.

In this embodiment, reference signal generator 610 has input labeled "fddConfigIn" receiving a binary number and an output labeled "LSIN" providing a pulse-density modulated signal. Generally, reference signal generator 610 operates to scale the pulse-density modulated signal based on the binary number. Reference signal generator 610 includes a control circuit 612, an expander 614, and a second order delta sigma modulator 616. Control circuit 612 has a first input receiving a 10-bit binary number carried on the fddConfigIn input, a second input receiving a reset signal labelled "resetDD", and an output labelled "ref" carrying the 10-bit binary number. Control circuit 612 generally operates to halt the passage of the 10-bit binary number when the resetDD indicates fast droop detector circuit 650 is disabled or reset, and pass the 10-bit binary number to the its output when the fast droop detector is operational. Expander 614 has an input connected to the output of control circuit 612 and an output. Expander 614 expands the 10-bit number to a 16-bit number.

In this implementation, delta-sigma modulator 616 is a second-order delta-sigma modulator having an input connected to the output of expander 614 and an output providing a pulse-density modulated binary signal LSIN. While delta-sigma modulation is used in this embodiment, other suitable modulation schemes may be employed to provide the pulse density modulated signal based on the binary number, which represents a desired voltage level for the monitored power supply.

Reference signal generator 610 generates a bitstream whose average value (ideally) equals a supply voltage VDD on which reference signal generator 610 operates, scaled by the 10-bit binary number received as a reference at the fddConfigIn input. The long-term average output voltage of the bitstream LSIN will correspond to Equation 1 below, with "ref_value" being the value of the 10-bit number supplied the fddConfigIn input:

$$<LSIN>avg=ref\_value*VDD \quad (1)$$

While this particular modulator design is employed in this embodiment, other embodiments employ other suitable delta-sigma modulator designs, or other types of modulators for producing a pulse-density modulated signal. The pulse-density modulated signal LSIN is fed to the input of fast droop detector circuit 650.

Fast droop detector circuit 650 includes a power sniffer 652, a level shifter 654, a lowpass filter 651, a comparator 661, a second level shifter 674, a latch 680, a two-to-one multiplexor 676, and an AND gate 678. Fast droop detector circuit 650 is suitable for use in the power supply monitor circuits of FIG. 3, FIG. 4, and FIG. 5, as well as other power supply monitor circuits.

Level shifter 654 has a first input receiving the pulse-density modulated signal LSIN, a second input receiving an enable signal from power sniffer 652, and an output providing the pulse-density modulated signal referenced to a clean supply voltage labeled "VDDCR_SOC" at the node labelled 655 (the voltage on this node is referred to as "voltage 655"). Level shifter 654 may also include an inverting input 653 to provide an inverter version of signal LSIN for use in level shifting. Level shifter 654 is supplied with two voltages for the two domains across which it shifts voltage levels, from VDD to VDDCR_SOC.

Power sniffer 652 has a first input receiving a power indication signal labeled "PwrOkVDD", a second input receiving the clean supply voltage VDDCR_SOC, and an output connected to level shifter 654. Power sniffer 652 enables level shifter 654 responsive to its two inputs when VDD is in a designated range.

Lowpass filter 651 has an input coupled to the output of level shifter 254 and an output. In the depicted embodiment, lowpass filter 651 includes two resistors 656 and 657, and two capacitors 658 and 660. Resistor 654 has a first terminal connected to the input of lowpass filter 651 and a second terminal. Resistor 657 has a first terminal connected to the second terminal of resistor 656 and a second terminal at the output of lowpass filter 651. Capacitor 654 has a first terminal connected to the second terminal of resistor 656 and a second terminal connected to ground. Capacitor 660 has a first terminal connected to the second terminal of resistor 657 and a second terminal connected to ground. While this particular lowpass filter design is employed herein with the depicted component values shown in FIG. 6, many other lowpass filter designs and component values are suitable for use in various embodiments.

Comparator 661 has a first input coupled to the output of lowpass filter 651, a second input receiving a monitored supply voltage VDDCORE, and an output. Generally, comparator 661 provides a droop detection signal at its output responsive to the monitored supply voltage VDDCORE dropping below a predetermined level relative to the first input. In this embodiment, comparator 661 comprises a series of four inverters including a first complimentary-metal-oxide-semiconductor (CMOS) inverter 662, a second CMOS inverter 664, a third CMOS inverter 666, and a fourth CMOS inverter 668. Each inverter 662, 664, 666, and 668 includes a positive supply terminal connected to the second input of the comparator to provide VDDCORE as the supply voltage for the inverters. CMOS inverter 662 has an input connected to first input of the comparator, and inverters 664, 666, and 668 are connected in series following inverter 662. The output of inverter 668 provides a droop detection signal to level shifter 674.

In this embodiment, inverters 662, 664, 666, and 668 are biased such that they are configured to operate in a "crowbar" mode or crowbar region of operation in which both the p-type metal-oxide semiconductor (PMOS) and n-type metal-oxide semiconductor (NMOS) sides of the inverter are turned on when the monitored supply voltage is at approximately the predetermined level relative to the voltage on the respective inverter input. In this embodiment, the predetermined level is twice the level of the voltage at the inverter input. Thus, as one-half of VDDCORE drops to the voltage at the output of lowpass filter 651, inverters 662, 664, 666, and 668 enter crowbar mode and switch from a digital low to a digital high to signal a droop. Such operation provides a high gain and fast response for detecting droops below a designated level relative to the threshold voltage provided at the input of inverter 662. Since the inverters are biased in a crowbar-state, they are highly sensitive to any noise on the input VDD rail. In some embodiments, at least inverter 662, or inverters 662 and 664, are biased in such a crowbar state.

Level shifter 674 has an input connected to the output of comparator 661, and an output. Level shifter 674 is supplied with both the VDDCORE supply voltage (the monitored voltage), and the VDD supply voltage. Level shifter 674 may also include an inverting input 673 to provide an inverter version of the droop comparator output for use in level shifting. Level shifter 674 operates to shift the droop detection signal to be referenced to the VDD voltage.

Multiplexor 676 has a first input connected to the output of level shifter 674 for receiving the droop detection signal, a second input, a selector input labeled "latchMode", and an output coupled to the clock gate (i.e., 360, FIG. 3, 560, FIG. 5) for gating a clock signal responsive to the droop detection signal.

Latch 680 is a set-reset (SR) flip flop having an "S" input connected to the output of level shifter 674, an "R" input receiving a reset signal labeled "resetDD_X", a "Q" output connected to the second input of multiplexor 676, and a "Q-NOT" output which is unused in this embodiment. The latchMode input of multiplexor 676 is used to select whether the between the two inputs.

AND gate 678 has a first input receiving an enable signal for the droop detection circuit labeled "FDDEN", a second input receiving the droop detection signal from the output of multiplexor 676, and an output providing the final output of fast droop detector circuit 650 labelled "droopDetected".

In operation, fast droop detector circuit 650 receives the LSIN pulse-density modulated signal. Due to the variability on VDD, this signal needs to be translated into a fixed voltage, which is accomplished through level shifter 654 supplied from VDDCR_SOC. This VDDCR_SOC voltage is a stable, regulated voltage providing a fixed amplitude for the level-shifted pulse-density modulated output of level shifter 654. The new, fixed amplitude signal feeds lowpass filter 651, which averages the value of the pulse-density modulated signal to produce a stable analog voltage to use with comparator 661. This stable analog value provides a threshold, for detecting droops in the VDDCORE voltage supply. In this embodiment, the threshold ("fdd threshold", FIG. 7) is twice the voltage of the stable analog value. Lowpass filter 61 is a double RC low pass filter operating with a cut-off frequency under 10 MHz.

The output of low pass filter 651 feeds the series of inverters in comparator 661 supplied from VDDCORE that acts as an analog comparator. Because they are biased in the "crowbar" region, the series of inverters responds quickly to droops below the designated threshold. Preferably at least two inverters are used to provide stability for the droop detected signal, and more preferably at least three or four (as shown). The droop detected signal at the output of comparator 661 is level shifted back to VDD domain to be used for controlling various circuits to mitigate power supply droop, such as the clock gate and PLL circuits depicted in FIG. 3, FIG. 4, and FIG. 5. Latch 680 is included to hold the droop detected signal at a digital HIGH for a designated period to provide proper timing for control of operations such as a one-time charge injection operation or a PLL adjustment. When latch 680 is enabled, the droop detected signal remains on once is triggered until is actively turned off by the local FSM.

Figure 7:
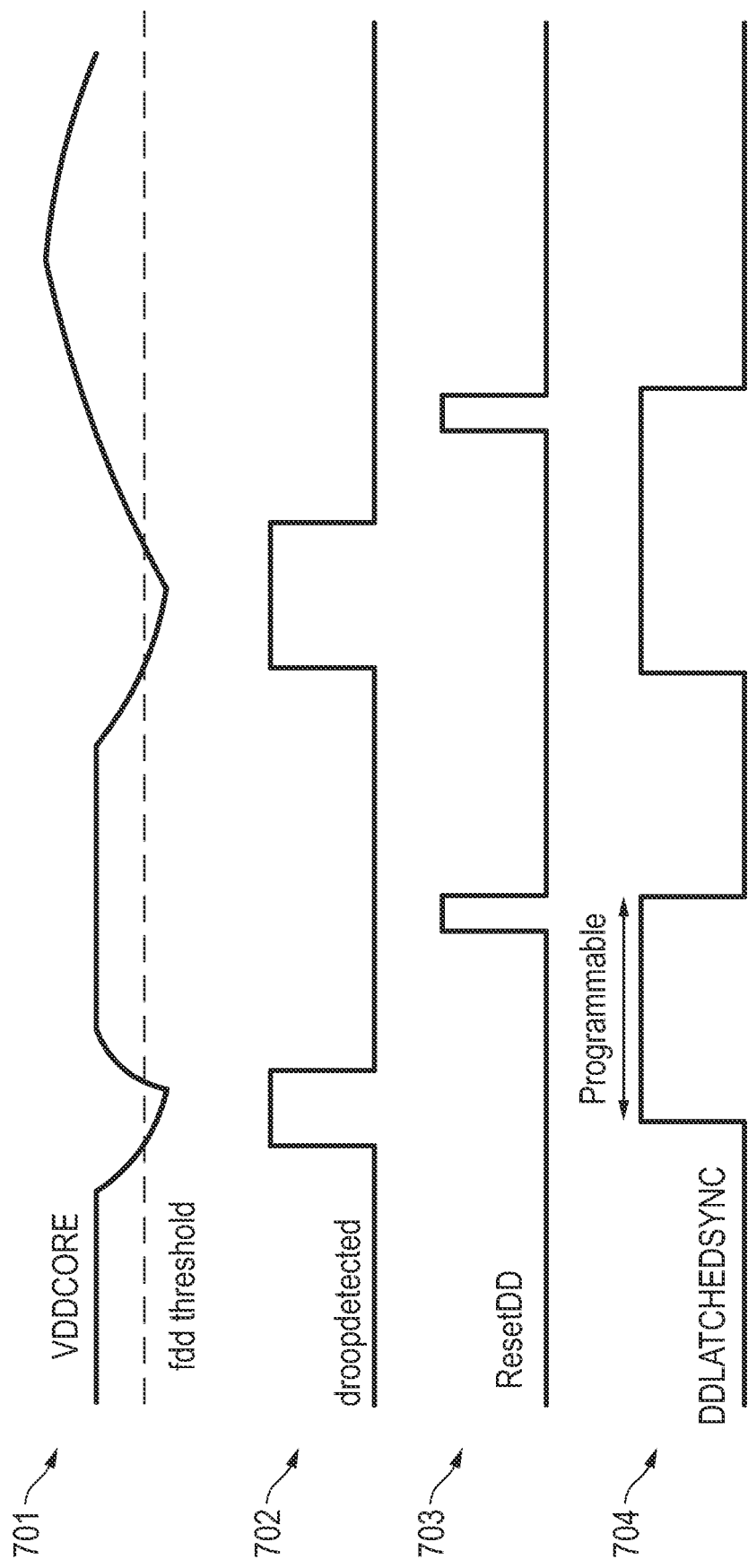
FIG. 7 shows four graphs depicting respective signals associated with fast droop detector circuit of FIG. 6 when employed to control a clock gate such as in the arrangement depicted in FIG. 3.

FIG. 7 shows four graphs depicting respective signals associated with power supply monitor 600 of FIG. 6 when employed in a circuit to control a clock gate such as the arrangement depicted in FIG. 3. The graphs 701, 702, 703, and 704 depict the operation over time as two droops are detected in the monitored supply voltage VDDCORE.

In graph 701, the monitored supply voltage VDDCORE is shown relative to the fdd threshold on which comparator 661 detects droops. VDDCORE droops below the threshold twice in the depicted scenario. Comparator 661 detects the droop and produces the "droopdetected" signal shown in graph 702. An FSM such as FSM 370 (FIG. 3, FIG. 4, FIG. 5), provides the signal "ResetDD". The ResetDD signal in graph 703 controls the operation of latch 680 to reset it after a droop is detected.

Graph 702 shows he latched droop detected signal, "DDLATCHEDYSNC", which is activated goes HIGH when the droop detected signal activates the latch output, and is held HIGH until it is reset by the FSM. The FSM has a programmable period which can be adjusted depending on the use of the DDLATCHEDSYNC signal, for example to gate a clock, adjust a PLL, or signal to a throttling control circuit that a particular circuit needs to be throttled.

Figure 8:
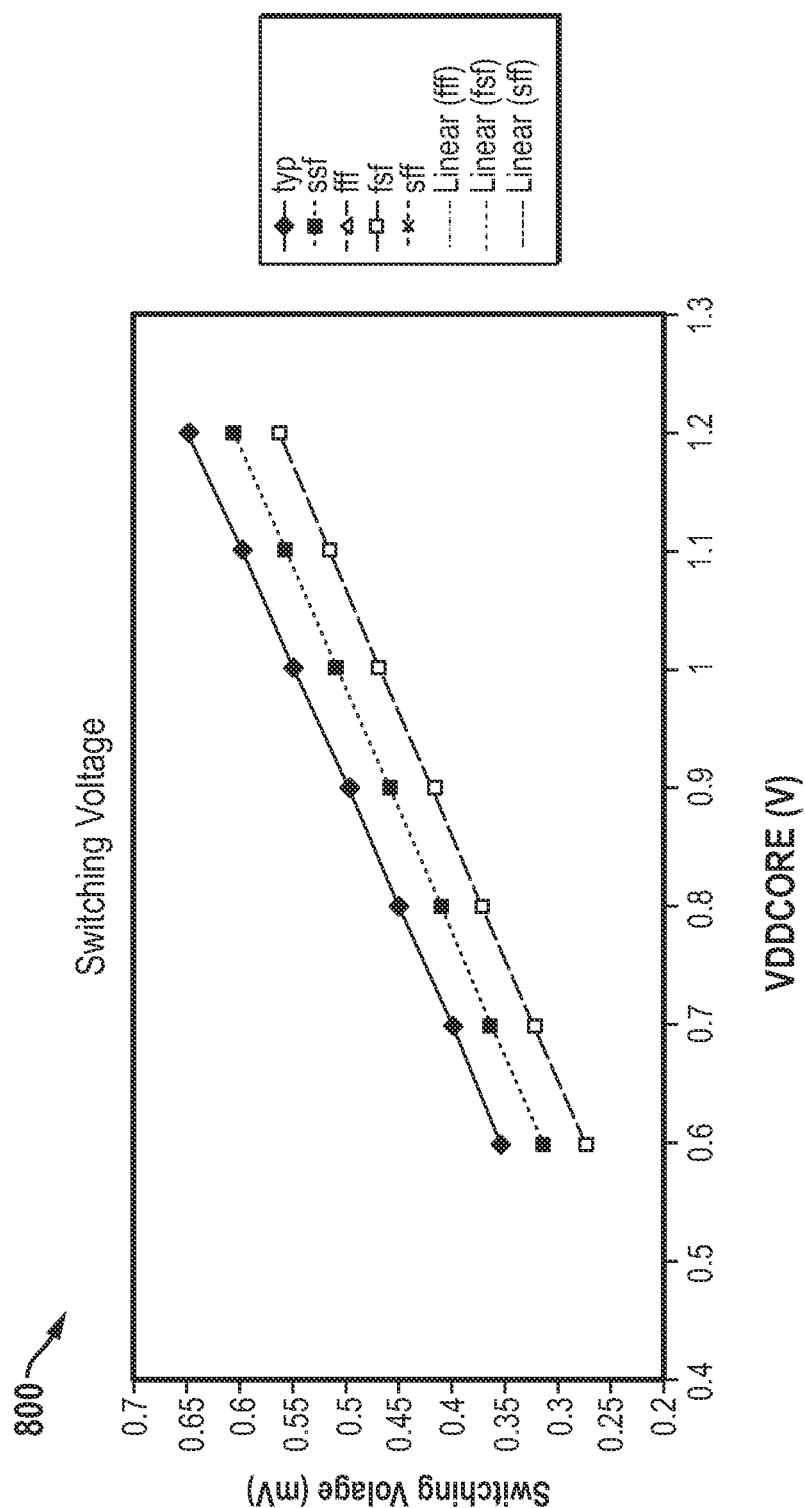
FIG. 8 shows a graph depicting switching voltage for an implementation of the power supply monitor circuit of FIG. 6.

FIG. 8 shows a graph 800 depicting switching voltage for an implementation of the power supply monitor circuit of FIG. 6. The chart shows the switching voltage in millivolts on the vertical axis with the monitored supply voltage VDDCORE along the horizontal axis. Plots are shown for various process corner conditions as shown on the legend.

As can be seen, the response of comparator 661 is very linear, enabling a 2-point calibration procedure to account for process variations.

Figure 9:
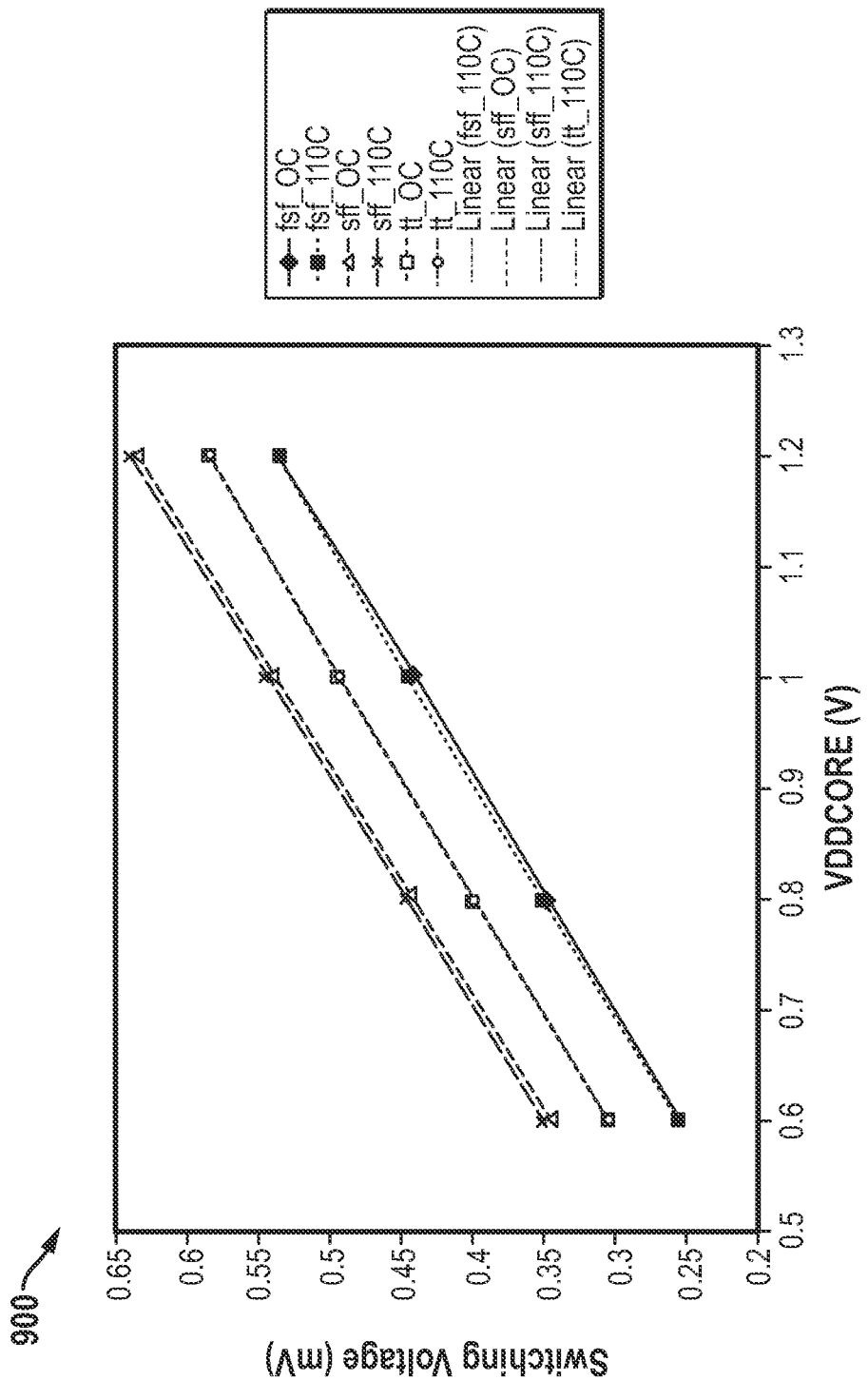
FIG. 9 shows a graph depicting switching voltage at different temperatures for an implementation of the power supply monitor circuit of FIG. 6.

FIG. 9 shows a graph 900 depicting switching voltage at different temperatures for an implementation of the power supply monitor circuit of FIG. 6. The performance also shows very little temperature variability (8 mV maximum at the high end), which allows a single temperature calibration to be used. Dynamic characterization has also been carried out to measure detection delays, which are defined as the time lapse from when VDDCORE crosses the ideal threshold to when droopDetected is asserted. The delay characterization depends heavily on the voltage slope. This characterization was carried out at (VDD−0.55V)/10 ns, which approximately corresponds to the maximum expected voltage slope for a zen core. The characterization showed the comparator circuit has the advantage of consistent performance across temperature.

The circuits of FIG. 3, FIG. 4, FIG. 5, and FIG. 6 or any portions thereof, such as DSM 610 and fast droop detector circuit 650, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A power supply monitor comprising:
   a delta-sigma modulator including an input receiving a binary number and an output providing a pulse-density modulated signal, the delta-sigma modulator operable to scale the pulse-density modulated signal based on the binary number; and
   a fast droop detector circuit including:
      a level shifter including an input receiving the pulse-density modulated signal and an output providing the pulse-density modulated signal referenced to a clean supply voltage;
      a lowpass filter having an input coupled to the output of the level shifter and an output; and
      a comparator including a first input coupled to the output of the lowpass filter, a second input receiving a monitored supply voltage, and an output, the comparator producing a droop detection signal at said output responsive to the monitored supply voltage dropping below a predetermined level relative to the first input.

2. The power supply monitor of claim 1, wherein the comparator comprises a series of inverters including at least a first complimentary-metal-oxide-semiconductor (CMOS) inverter and a second CMOS inverter each including a positive supply terminal connected to the second input of the comparator, the first CMOS inverter including an input connected to first input of the comparator, the first CMOS inverter configured to operate in a crowbar mode when the monitored supply voltage is at the predetermined level.

3. The power supply monitor of claim 2, wherein the comparator further comprises a level shifter coupled to an output of the series of inverters for shifting the droop detection signal to be referenced to the monitored supply voltage, and a latch coupled to the output of the level shifter.

4. The power supply monitor of claim 1, wherein the fast droop detector circuit further comprises:
a clock gate coupled to a clock that provides a clock signal synchronizing circuitry within a domain of the monitored supply voltage; and
a latch with an input receiving the droop detection signal and an output coupled to the clock gate for gating the clock signal responsive to the droop detection signal.

5. The power supply monitor of claim 3, wherein the fast droop detector circuit further comprises:
a state machine including an input receiving the droop detection signal and an output coupled to control the latch for resetting the droop detection signal.

6. The power supply monitor of claim 1, further comprising a local power controller for a voltage domain of the monitored supply voltage, the local power controller operable to adjust the monitored supply voltage and provide a new value for the binary number to the delta-sigma modulator corresponding to the adjusted monitored supply voltage.

7. A method of monitoring a power supply, the method comprising:
receiving a binary number;
creating a pulse-density modulated signal referenced to a first supply voltage and scaled based on the binary number;
level shifting the pulse-density modulated signal to produce a level-shifted pulse-density modulated signal referenced to a clean supply voltage; and
lowpass filtering the level-shifted pulse-density modulated signal to create an analog signal; and
comparing the analog signal to a monitored supply voltage to detect a droop in the monitored supply voltage.

8. The method of claim 7, wherein comparing the analog signal to the monitored supply voltage is performed using at least one complimentary-metal-oxide-semiconductor (CMOS) inverter operating in a crowbar mode when the monitored supply voltage is at a designated level relative to the analog signal.

9. The method of claim 8, wherein the at least one CMOS inverter comprises three series-connected inverters.

10. The method of claim 9, further comprising, responsive to detecting the droop is no longer present in the monitored supply voltage, latching a droop detection signal for a designated period.

11. The method of claim 7, further comprising, responsive to detecting the droop in the monitored supply voltage, gating a clock that synchronizes circuitry in a domain of the monitored supply voltage.

12. The method of claim 7, further comprising, responsive to detecting the droop in the monitored supply voltage, slowing a clock that synchronizes circuitry in a domain of the monitored supply voltage.

13. The method of claim 7, further comprising altering a target value of the monitored supply voltage, and altering the binary number to provide a new value associated with the altered target value of the monitored supply voltage.

14. A data processing system, comprising:
an integrated circuit including at least two processor tiles each comprising: a processor core comprising digital logic, a local clock providing a clock signal for synchronizing the digital logic, and a local power supply monitor for monitoring a respective monitored local supply voltage, each power supply monitor comprising:
a delta-sigma modulator including an input receiving a binary number and an output providing a pulse-density modulated signal referenced to a first supply voltage, the delta-sigma modulator operable to scale the pulse-density modulated signal based on the binary number; and
a droop detection circuit including:
a level shifter including an input receiving the pulse-density modulated signal and an output providing the pulse-density modulated signal referenced to a clean supply voltage;
a lowpass filter including an input coupled to the output of the level shifter and an output; and
a comparator including a first input coupled to the output of the lowpass filter, a second input receiving a respective monitored local supply voltage, and an output, the comparator producing a droop detection signal at said output responsive to the respective monitored local supply voltage dropping below a predetermined level relative to the first input.

15. The data processing system of claim 14, wherein the comparator comprises a series of inverters including at least a first complimentary-metal-oxide-semiconductor (CMOS) inverter and a second CMOS inverter each including a positive supply terminal connected to the second input of the comparator, the first CMOS inverter including an input connected to first input of the comparator, the first CMOS inverter configured to operate in a crowbar mode when the respective monitored local supply voltage is the predetermined level.

16. The data processing system of claim 15, wherein the comparator further comprises a level shifter coupled to an output of the series of inverters for shifting the droop detection signal to be referenced to the first supply voltage, and a latch coupled to the output of the level shifter.

17. The data processing system of claim 16, wherein the level shifter is supplied with a stable supply voltage.

18. The data processing system of claim 14, further comprising
a clock gate coupled to the respective local clock; and
a latch with an input receiving the droop detection signal and an output coupled to the clock gate for gating the clock signal responsive to the droop detection signal.

19. The data processing system of claim 18, further comprising
a state machine including an input receiving the droop detection signal and an output coupled to control the latch for resetting the droop detection signal.

20. The data processing system of claim 14, wherein each processor tile further comprises a local power controller for a voltage domain of the respectively monitored local supply voltage, the local power controller operable to adjust the monitored local supply voltage and provide a new value for the binary number to the delta-sigma modulator corresponding to the adjusted monitored local supply voltage.

\* \* \* \* \*